United States Patent
Wu et al.

(10) Patent No.: US 9,543,382 B1
(45) Date of Patent: Jan. 10, 2017

(54) FINFET WITH IMPROVED SEU PERFORMANCE

(71) Applicant: Altera Corporation, San Jose, CA (US)

(72) Inventors: Wen Wu, Mountain View, CA (US); Yanzhong Xu, Santa Clara, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/663,237

(22) Filed: Mar. 19, 2015

(51) Int. Cl.
*H01L 27/092* (2006.01)
*H01L 29/06* (2006.01)
*H01L 27/088* (2006.01)
*H01L 21/265* (2006.01)
*H01L 29/66* (2006.01)
*H01L 21/8238* (2006.01)

(52) U.S. Cl.
CPC ..... *H01L 29/0638* (2013.01); *H01L 21/26533* (2013.01); *H01L 21/823821* (2013.01); *H01L 27/0886* (2013.01); *H01L 29/66795* (2013.01)

(58) Field of Classification Search
CPC ............... H01L 21/823821; H01L 21/823431; H01L 27/0886; H01L 27/0924; H01L 29/66795; H01L 29/785–29/7856
See application file for complete search history.

(56) References Cited

U.S. PATENT DOCUMENTS

| 8,643,108 | B2 | 2/2014 | Rahim et al. |
| 2013/0015517 | A1* | 1/2013 | Widjaja ................. G11C 11/404 257/316 |
| 2014/0097518 | A1* | 4/2014 | Cheng ................. H01L 27/0886 257/618 |
| 2014/0120677 | A1* | 5/2014 | Pham ................. H01L 29/66795 438/283 |
| 2015/0044829 | A1* | 2/2015 | Kim ................. H01L 21/823807 438/199 |
| 2015/0102386 | A1* | 4/2015 | Chen ............... H01L 21/823431 257/192 |
| 2015/0303281 | A1* | 10/2015 | Fogel ................. H01L 29/66795 257/288 |

* cited by examiner

Primary Examiner — Bryan Junge

(57) ABSTRACT

Illustratively, a finFET comprises at least one fin, and typically several fins, with a trapping region in or on a substrate at the base of each fin to trap ions produced by radiation incident on the substrate. In one embodiment, the trapping region is an implanted region having a conductivity type opposite that of the substrate. In another, the trapping region is a defect region. In another, the trapping region is an epitaxial region grown on the substrate. The finFET is formed by forming the fin or fins and then forming the trapping region at the base of the fin. Illustratively, the trapping region is formed by implanting in the substrate ions having a conductivity type opposite that of the substrate or by creating defects in the substrate or by epitaxially growing a region or regions having an opposite conductivity type to that of the substrate.

17 Claims, 8 Drawing Sheets

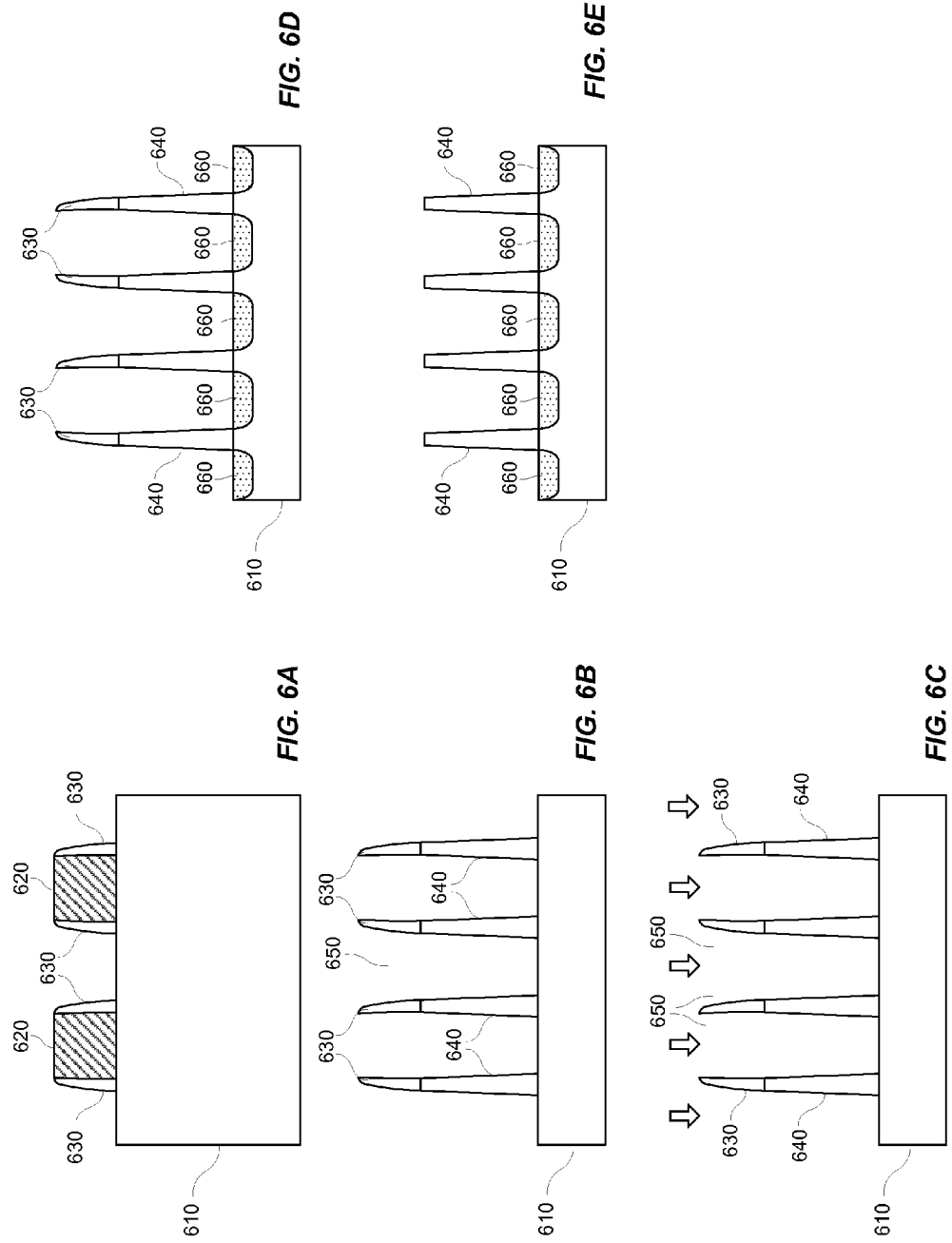

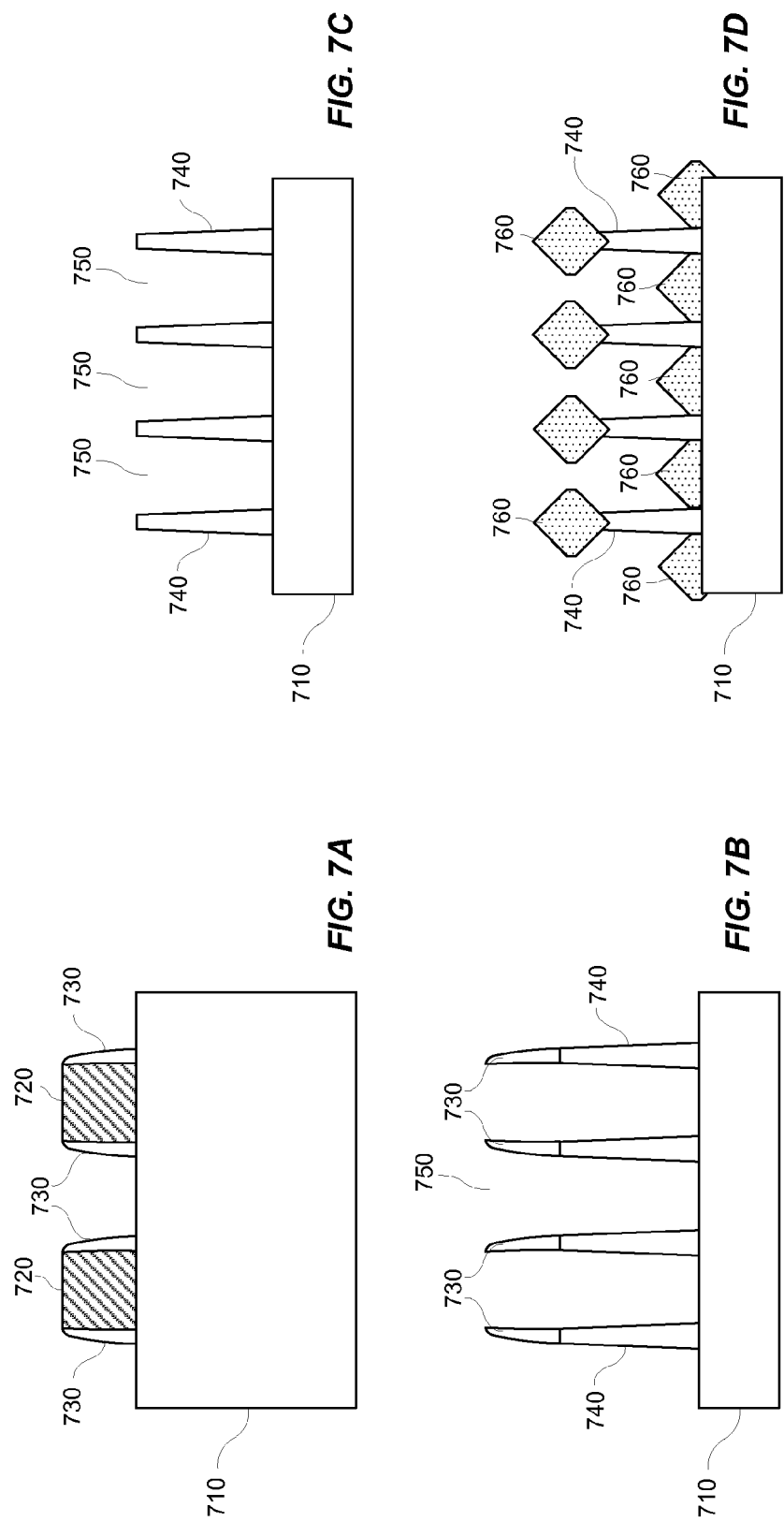

FINFET WITH IMPROVED SEU PERFORMANCE

BACKGROUND

FinFETs (fin field effect transistors) are non-planar field effect transistors. A fin is a thin segment of semiconductor material standing on edge, thereby making available multiple surfaces for the formation of gate structures. The fins have first and second major surfaces that are opposite one another and usually are symmetric about a center plane that bisects the fin lengthwise. The major surfaces are often illustrated as being parallel as in U.S. Pat. No. 7,612,405 B2 or Pub. No. US2008/0128797 A1, which are incorporated herein by reference; but process limitations usually result in surfaces that slope outwardly from top to bottom of the fin with the result that the cross-section of the fin is trapezoidal in shape. In some cases, the two major surfaces meet at the top. In some embodiments, a separate gate structure may be located on each surface of each fin. In other embodiments, there is a common gate structure for all surfaces.

Doped source and drain regions are located on opposite sides of the gates. As in a planar FET, a voltage applied to the gate controls current flow in the channel that extends between the source and drain regions in the semiconductor beneath the gate.

Typically, finFETs are extremely small. Fin heights are usually on the order of tens of nanometers (nm.).

Unfortunately, the extremely small dimensions of typical finFET devices make the devices susceptible to single event upsets (SEUs) (sometimes also referred to as soft error upsets) and electronic noise signals. SEUs may be caused by radiation that generates electron-hole pairs at a sensitive node within a cell. The operation and performance of an integrated circuit may be substantially compromised by such SEUs. For example, field programmable gate arrays (FPGAs) and other programmable logic devices (PLDs) may be particularly sensitive to SEUs occurring in configuration random access memory (CRAM) cells. Other types of integrated circuits, such as microprocessors and application specific integrated circuits (ASICS), may also be sensitive to SEUs.

In addition, finFET devices are also susceptible to electronic noise signals which may be transmitted by way of conductive paths from other parts of an integrated circuit. In particular, substrate noise may adversely impact the performance of a finFET device used in an analog circuit application.

SUMMARY

In an illustrative embodiment, a finFET of the present invention comprises at least one fin, and typically several fins, with a trapping region in or on a substrate at the base of each fin. The trapping region traps some of the electrons or holes produced by radiation incident on the substrate. In a first illustrative embodiment, the trapping region is an implanted region having a conductivity type opposite that of the substrate. In a second illustrative embodiment, the trapping region is a defect region formed in the substrate at the base of the fin. In a third illustrative embodiment, the trapping region is an epitaxial region grown on the substrate.

In an illustrative embodiment, the finFET is formed by forming the fin or fins and then forming the trapping region at the base of the fin. Illustratively, the trapping region is formed by implanting in the substrate ions having a conductivity type opposite that of the substrate. Alternatively, the trapping region is formed by creating defects in the substrate at the base of one or more fins. Alternatively, the trapping region is formed by epitaxially growing on the substrate a region or regions having an opposite conductivity type to that of the substrate.

Numerous variations may be practiced in the illustrative embodiment.

BRIEF DESCRIPTION OF THE DRAWINGS

These and other objects and advantages of the present invention will be apparent to those of ordinary skill in the art in view of the following detailed description in which:

FIGS. 6A-6E are cross-sections depicting various stages in an illustrative implementation of the invention; and FIGS. 7A-7D are cross-sections depicting various stages in another illustrative implementation of the invention

DETAILED DESCRIPTION

Figure 1A:
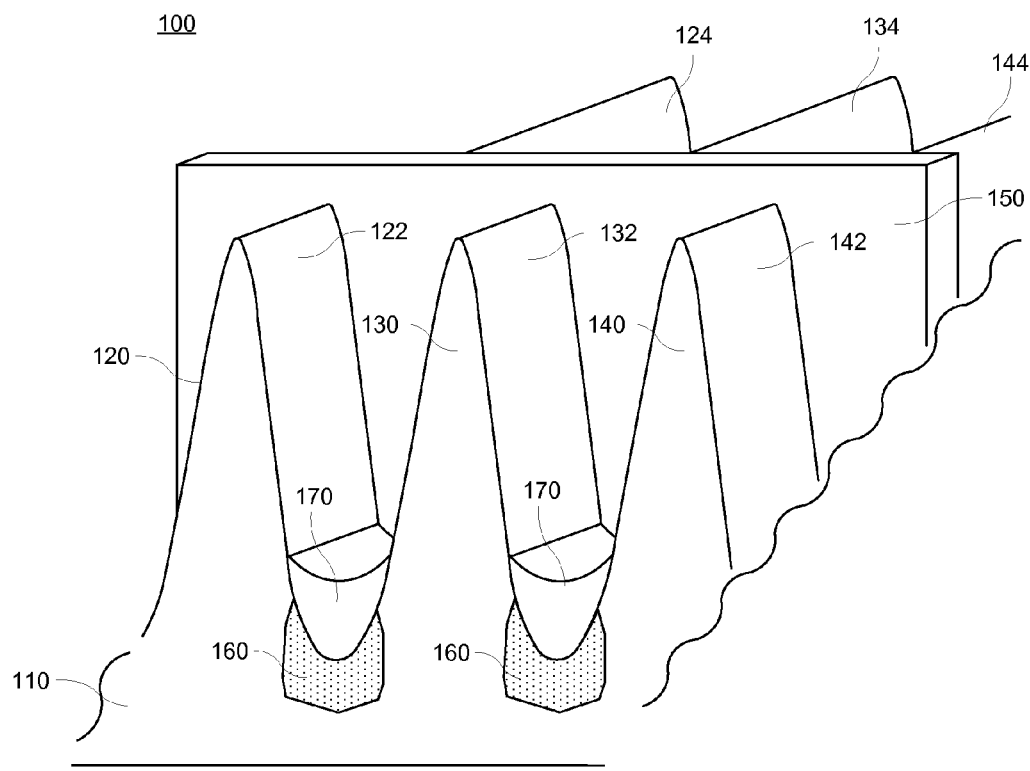
FIGS. 1A, 1B and 1C are a prospective view, a plan view and a cross-sectional view of a first illustrative embodiment of the invention.
Figure 1B:
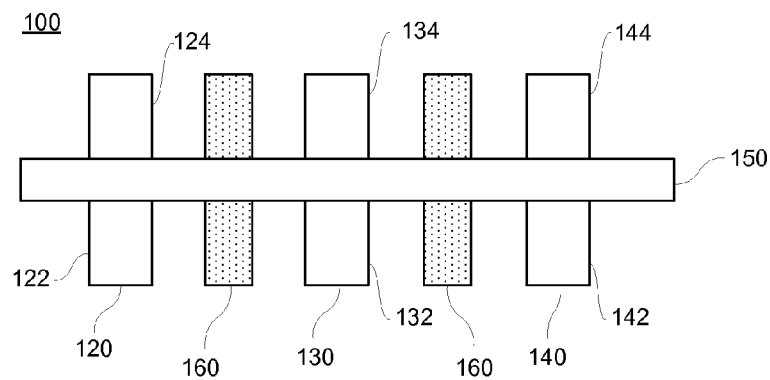
Figure 1C:
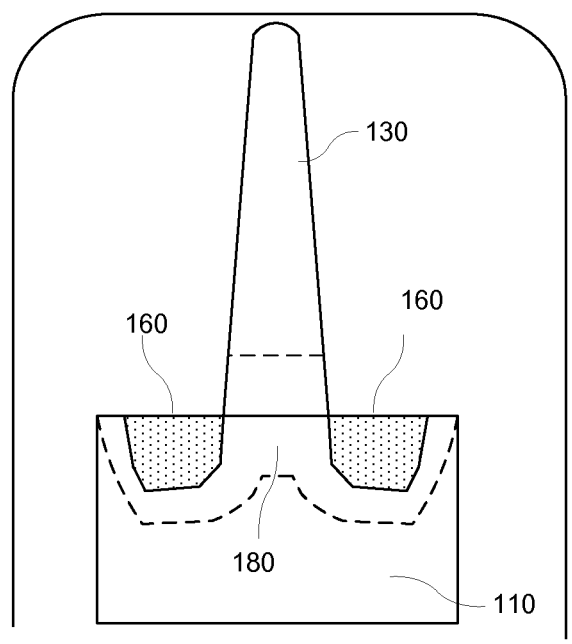

FIGS. 1A, 1B, and 1C are a prospective view, a plan view and a cross-sectional view of a first illustrative embodiment of the invention. As best shown in FIG. 1A, finFET device 100 comprises a substrate 110 and a plurality of fins 120, 130, 140 extending upwards from the substrate. A gate structure 150 is formed on each fin with source and drain regions 122, 124; 132, 134; 142, 144 on opposite sides of the gate. The fins are integral with the substrate and typically are formed by etching parallel channels in the substrate. This basic structure will be familiar to those skilled in the art.

In accordance with the invention, a trapping region 160 is formed in or on the substrate at the base of one or more of fins 120, 130, 140. As shown in FIGS. 1A-1C, one trapping region 160 extends along the substrate between the pair of adjacent fins 120, 130; and another trapping region 160 extends along the substrate between the pair of adjacent fins 130, 140. This arrangement, however, is only illustrative. More fins may be used; and as few as one fin may be used in the practice of the invention. Additional trapping regions may also be used such that there is a trapping region at the base on each side of each fin. And only a single trapping region can be used at the base of one of the fins. A field oxide region 170 is formed on top of each trapping region.

In the embodiment shown in FIGS. 1A, 1B and 1C, the trapping regions are doped regions that are doped with ions having a conductivity type that is opposite to that of the conductivity type of the substrate. For example, if the conductivity type of the substrate is p-type, the trapping region is doped with an n-type dopant such as Arsenic. If the conductivity type of the substrate is n-type, the trapping region is doped with a p-type dopant such as Boron.

Advantageously, trapping regions 160 are coupled together and coupled directly or indirectly to a voltage source so as to reverse bias a p-n junction between the doped region of the trapping region and the oppositely-doped substrate. Thus, in the case of an n-type implant, the trapping region is coupled directly or indirectly to a positive voltage source such as Vcc; and in the case of a p-type implant, the trapping region is coupled directly or indirectly to a negative voltage source or to ground, Vss. When a single event strike occurs, the implanted regions provide a low resistance path to the positive voltage source or to ground; and the charges produced by the strike do not reach the source or drain regions of the finFETs.

FIG. 1C is a cross-section illustrating in more detail a depletion region 180 created when a reverse bias is applied to an implanted region of one conductivity type in a substrate of opposite conductivity type.

Figure 2A:
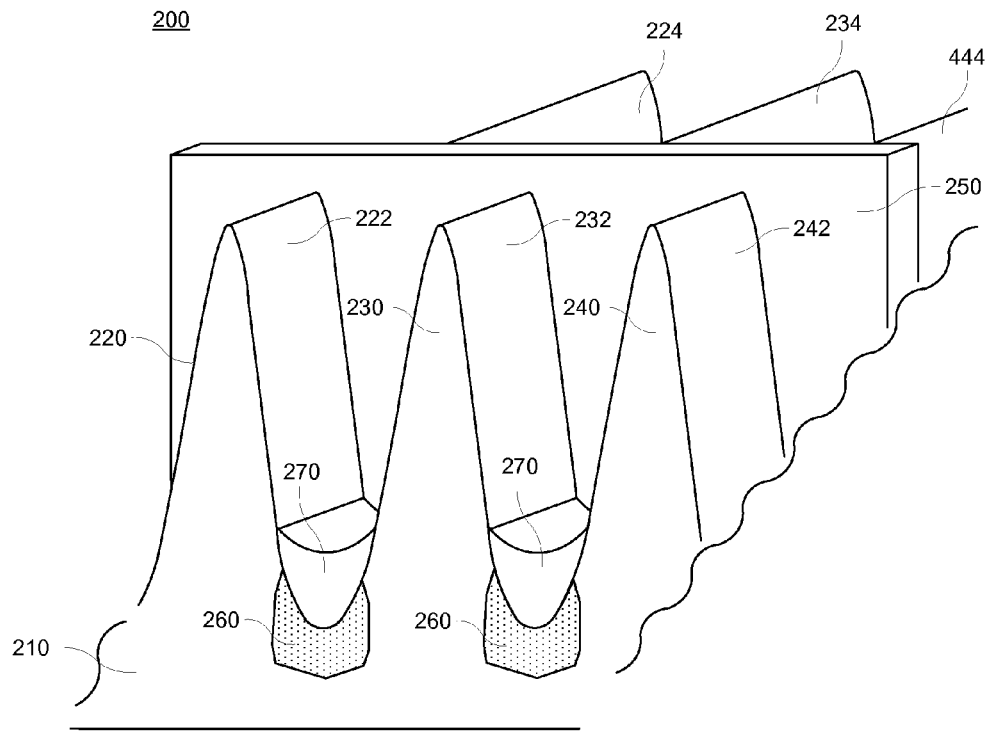
FIGS. 2A and 2B are a prospective view and a plan view of a second illustrative embodiment of the invention.
Figure 2B:
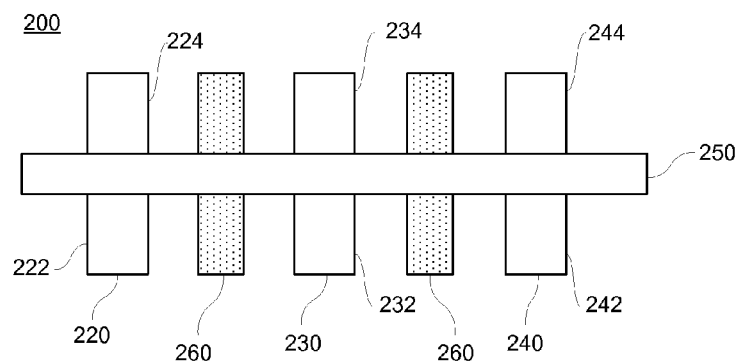

Alternatively, in a second illustrative embodiment, a high-defect layer may be created in the trapping region by bombarding the substrate with particles of sufficient energy to destroy the crystalline structure of the semiconductor substrate in the trapping region. FIGS. 2A and 2B are a prospective view and a plan view of this embodiment. As best shown in FIG. 2A, finFET device 200 comprises a substrate 210 and a plurality of fins 220, 230, 240 extending upwards from the substrate. A gate structure 250 is formed on each fin with source and drain regions 222, 224; 232, 234; 242, 244 on opposite sides of the gate. The fins are integral with the substrate and typically are formed by etching parallel channels in the substrate.

In accordance with the invention, a trapping region 260 is formed in or on the substrate at the base of one or more of fins 220, 230, 240 by bombarding the substrate with particles of sufficient energy to destroy the crystalline structure of the semiconductor substrate in the trapping region. As shown in FIG. 2B, one trapping region 260 extends along the substrate between the pair of adjacent fins 220, 230; and another trapping region 260 extends along the substrate between the pair of adjacent fins 230, 240. Again, however, this arrangement is only illustrative. More fins may be used; and as few as one fin may be used in the practice of the invention. Additional trapping regions may also be used such that there is a trapping region at the base on each side of each fin. And only a single trapping region can be used at the base of one of the fins. A field oxide region 270 is formed on top of trapping region 260.

In this case, excess charges produced by the single event strike recombine in the high defect layer of trapping region 260 and do not reach the source or drain regions in the finFETs.

Figure 3A:
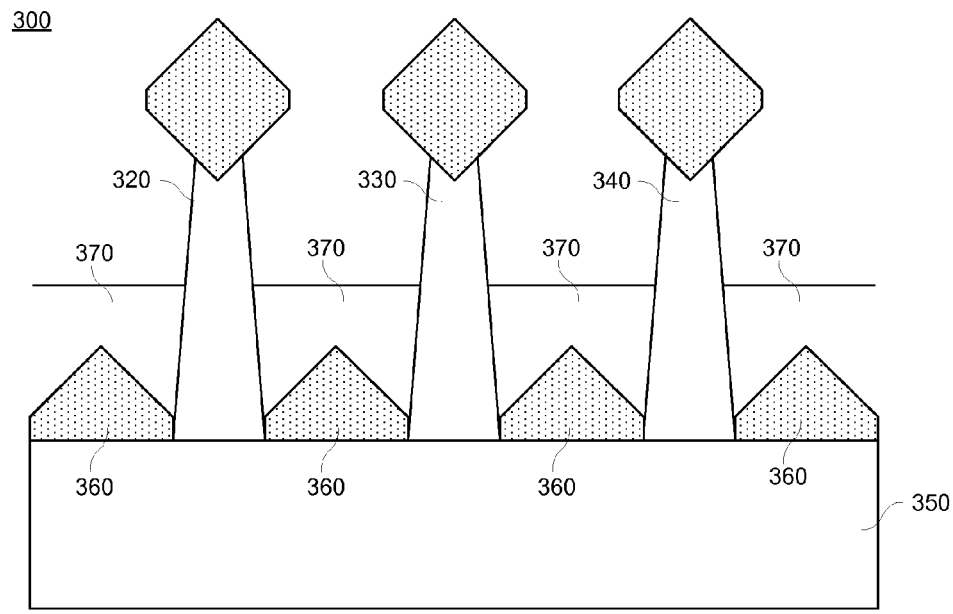
FIGS. 3A and 3B are a cross-sectional view and a plan view of a third illustrative embodiment of the invention.
Figure 3B:
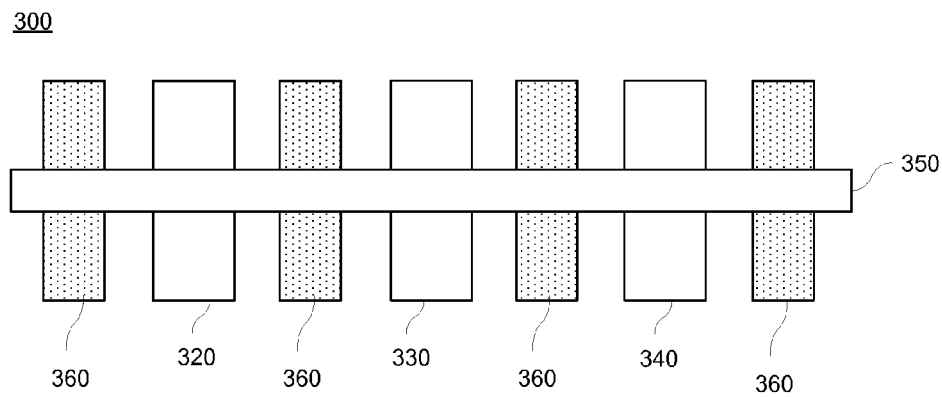

Alternatively, a trapping region comprising an epitaxial region having a conductivity type opposite to that of the substrate may be created on the substrate by growing the region epitaxially. FIGS. 3A and 3B are a cross-sectional view and a plan view of this embodiment. FinFET device 300 comprises a substrate 310 and a plurality of fins 320, 330, 340 extending upwards from the substrate. A gate structure 350 is formed on each fin with source and drain regions 322, 324; 332, 334; 342, 344 on opposite sides of the gate. The fins are integral with the substrate and typically are formed by etching parallel channels in the substrate.

In accordance with the invention, a trapping region 360 is formed on the substrate at the base of one or more of fins 320, 330, 340 by growing epitaxial regions on the substrate that have opposite conductivity-type to that of the substrate. As shown in FIG. 3B, a trapping region 360 extends along the substrate on each side of the base of each fin 320, 330, 340. This arrangement, however, is only illustrative. More fins may be used; and as few as one fin may be used in the practice of the invention. As few as one trapping region at the base of one fin may be used in the practice of the invention. Illustratively, a field oxide region 370 is formed on top of each trapping region 360.

Advantageously, trapping regions 360 are coupled together and coupled directly or indirectly to a voltage source so as to reverse bias a p-n junction between the doped region of the trapping region and the oppositely-doped substrate. Thus, in the case of an n-type implant, the trapping region is coupled directly or indirectly to a positive voltage source such as Vcc; and in the case of a p-type implant, the trapping region is coupled directly or indirectly to a negative voltage source or to ground, Vss. When a single event strike occurs, the epitaxial regions provide a low resistance path to the positive voltage source or to ground; and the charges produced by the strike do not reach the source or drain regions of the finFETs.

Figure 4:
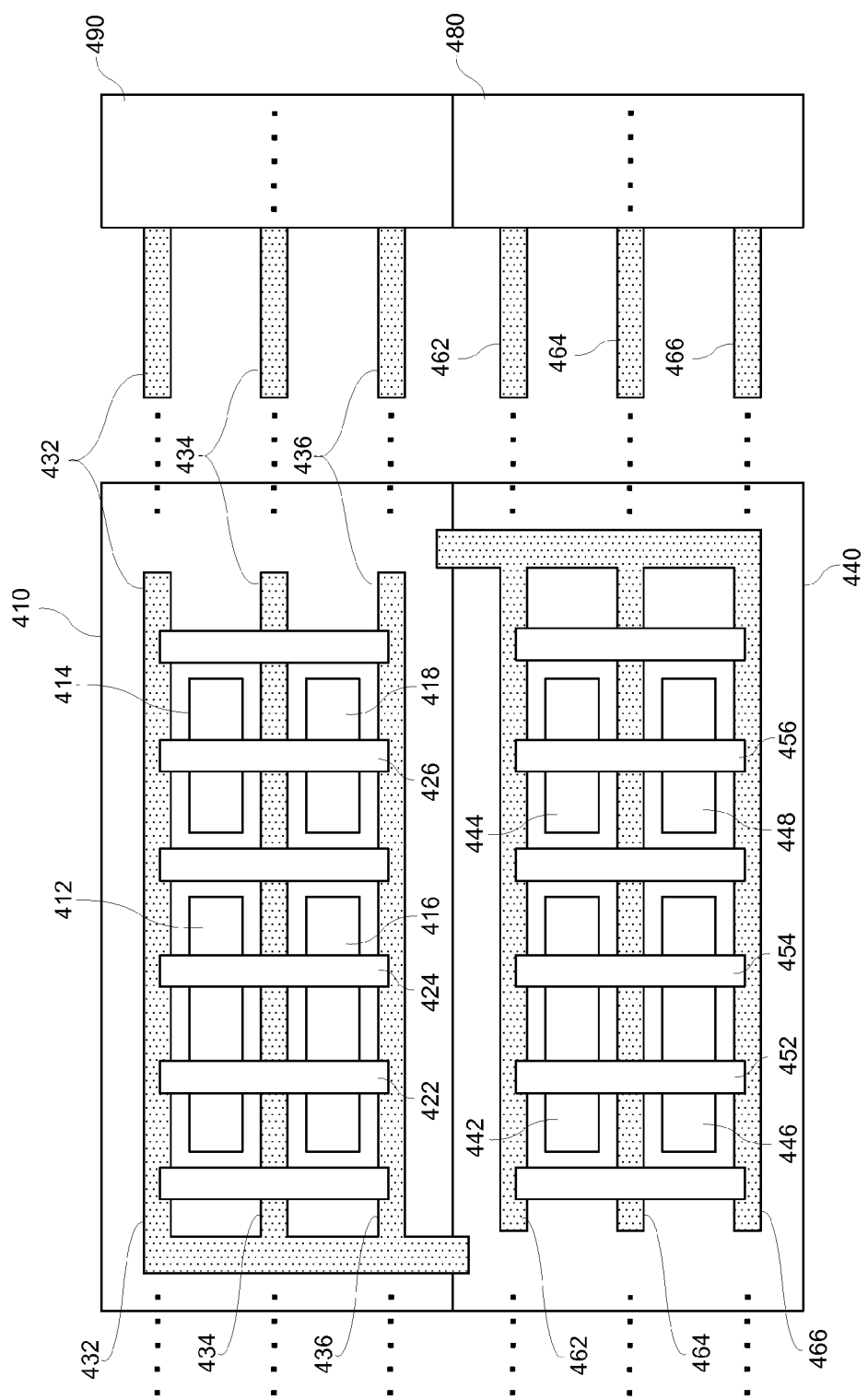
FIG. 4 is a plan view of a layout in which the first, second, and third illustrative embodiments of the invention may be used.

An illustrative layout 400 that provides finFETs having both n-type implants and p-type implants is shown in FIG. 4. Layout 400 comprises first and second p-wells 410, 480 and first and second n-wells 440, 490. In first p-well 410 are four fins 412, 414, 416, 418 and three gates 422, 424, 426. On each side of fins 412 and 414 are trapping regions 432, 434; and on each side of fins 416, 418 are trapping regions 434, 436. Similarly, in first n-well 440 are four fins 442, 444, 446, 448 and three gates 452, 454, 456. On each side of fins 442 and 444 are trapping regions 462, 464; and on each side of fins 446, 448 are trapping regions 464, 466.

As shown in FIG. 4, trapping regions 432, 434, 436 are connected together and coupled to n-well 490; and trapping regions 462, 464, 466 are connected together and coupled to p-well 480. Thus, if trapping regions 432, 434, 436 are doped with n-type ions, a reverse biased junction is formed between these trapping regions and p-well 410; and if trapping regions 462, 464, and 466 are doped with p-type ions, a reverse biased junction is formed between these trapping regions and n-well 440. Alternatively, the trapping regions could be left floating.

In other embodiments, trapping regions 432, 434, 436 and 462, 464, 466 may be defect regions or epitaxial regions such as those described in conjunction with FIGS. 2A and 2B and 3A and 3B, respectively.

Regardless of the composition of the trapping regions, the layout of FIG. 4 is only illustrative. More fins may be used; and as few as one fin may be used in the practice of the invention. Fewer trapping regions may also be used such that a trapping region is not found at the base on each side of each fin. And only a single trapping region can be used at the base of only one of the fins.

Figure 5:
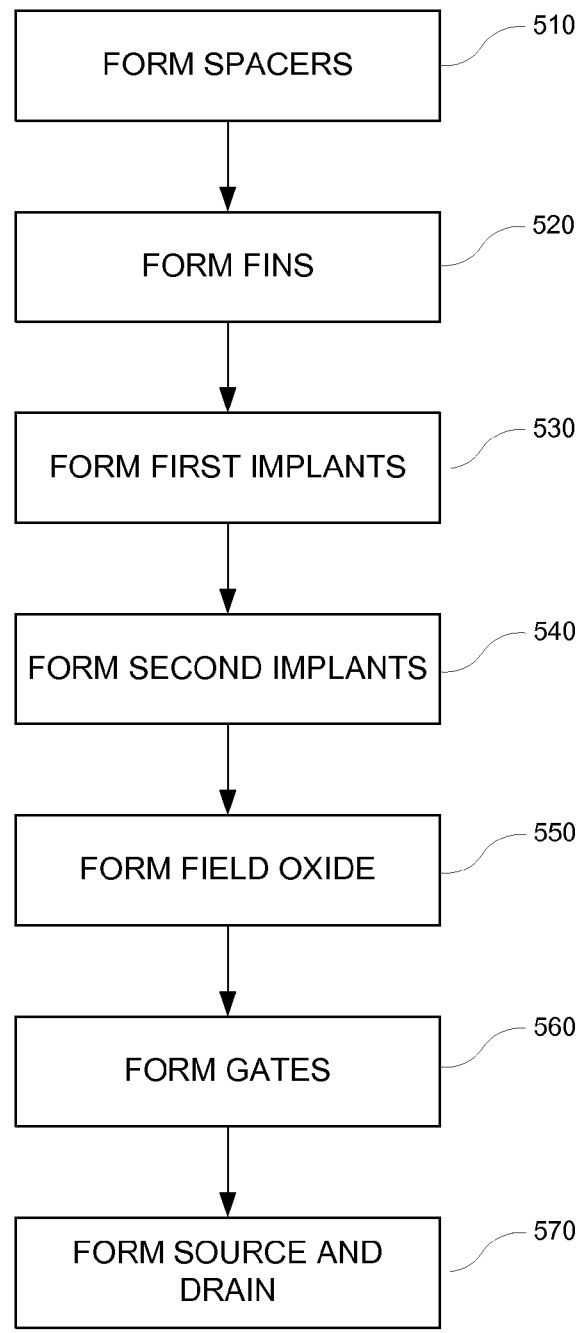
FIG. 5 is a flow chart depicting an illustrative embodiment of the method of the invention.

FIG. 5 is a flow chart depicting an illustrative embodiment of the invention as used in a process to form a semiconductor structure. Illustratively, the process is performed on a wafer of semiconductor material such as monocrystalline silicon that may be up to 12 inches (300 mm.) in diameter in today's state-of-the-art processes. Typically, numerous identical integrated circuits are formed simultaneously in the wafer, each of which circuits includes one or more finFET circuit structures of the type described herein. After processing of the wafer is completed, the wafer is broken apart into the individual integrated circuit die. FIGS. 6A-6E depict illustrative cross-sections of several finFETs at certain steps when the process of FIG. 5 is used to form finFETs with implanted trapping regions. FIGS. 7A-7D depict illustrative cross-sections of several finFETs at several steps when the process of FIG. 5 is used to form finFETs with epitaxially-grown trapping regions.

At steps 510 and 520 of FIG. 5, the wafer is processed to form on one of its major surfaces a plurality of integrated circuits each of which includes a plurality of thin segments (or fins) of a first semiconductor material such as silicon. The segments are integral with the wafer in which they are formed, are substantially parallel to one another, and advantageously are spaced apart by approximately the minimum line-width achievable with the technology used to form them.

The thin segments have first and second opposing major surfaces and, illustratively are identical to those that would be formed in making conventional finFETs. While the first and second opposing major surfaces are often illustrated as being parallel to each other, it will be understood that process limitations often result in a structure in which the first and second major surfaces slope outwardly from top to bottom of the segment so that the cross-section of the segment is trapezoidal in shape.

There are numerous ways to form the fins of a FinFET. Illustratively, a plurality of parallel, spaced-apart linear elements are formed on the surface of the silicon wafer where the finFETs are to be formed. Illustratively, the linear elements are dummy gate structures. The linear elements are approximately rectangular in cross-section and have a width that is approximately the desired spacing between adjacent fins of the finFET. Typically, this spacing is the minimum line-width achievable.

Spacers are then formed on the sides of the linear elements. Illustratively, a layer of appropriate material such as silicon nitride is deposited on the linear elements and the exposed surface of the silicon; and this layer is then anisotropically etched to remove all of the deposited layer down to the upper surfaces of the linear elements and the silicon except for narrow spacer regions on the sides of the linear elements.

The resulting structure is shown in the cross-section FIG. 6A which depicts a silicon substrate 610, linear elements 620 and spacers 630. Advantageously the width of the linear elements 620 is approximately the minimum line-width achievable by the technology used to form the linear elements. The width of the spacers is considerably smaller than the width of the linear elements.

The same structure is shown in FIG. 7A which depicts a silicon substrate 710, linear elements 720, and spacers 730 used in forming another embodiment of the invention.

The linear elements are then removed, thereby exposing the semiconductor material between the spacers. The spacers are then used in step 520 as hard masks in an etching process that removes the semiconductor material except for the material underlying the spacers, thereby forming channels in the semiconductor material that define a plurality of fins. The resulting structure as shown in FIG. 6B comprises silicon wafer 610, fins 640 which are capped by spacers 630 and channels 650 between fins 640. FIG. 7B similarly comprises silicon wafer 710, fins 740 which are capped by spacers 730 and channels 750 between fins 740.

The trapping regions are then formed. Where the trapping regions are doped implants, both p-type and n-type implants are typically formed in the same device. To do this, at step 530, regions where the n-type implants are not to be made are masked off and the n-type implants are then made in the substrate as shown in FIG. 6C. The resulting structure comprises wafer 610, fins 640, spacers 630, channels 650, and n-type implant regions 660 in the substrate between fins 640. This process is then repeated at step 540 for the p-type implant. Regions where the p-type implants are not to be made are masked off and the p-type implants are then made. The resulting structure is the same as that shown in FIG. 6C except that the implants in the substrate are p-type.

The spacers are then removed from the tops of fins 640 as shown in FIG. 6D. And a field oxide is then formed at step 550 on top of the trapping region.

The finFETs are then completed by forming one or more gates on the fins at step 560; and the gate is used as a mask for another ion implantation at step 570 that dopes the fins to form source and drain regions.

Where the trapping regions are doped epitaxial regions, both p-type and n-type epitaxial regions are typically formed in the same device. To do this, the spacers at the tops of fins 740 are removed as shown in FIG. 7C. Then, at step 530, regions where the n-type epitaxial regions are not to be grown are masked off and the n-type epitaxial regions are then grown as shown in FIG. 7D. The resulting structure comprises wafer 710, fins 740, channels 750, and n-type epitaxial regions 760 in the substrate between fins 740 as well as one the upper surfaces the fins. This process is then repeated at step 540 for the p-type implant. Regions where the p-type epitaxial regions are not to be grown are masked off and the p-type epitaxial regions are then grown. The resulting structure is the same as that shown in FIG. 7D except that the epitaxial regions on the substrate are p-type.

A field oxide is then formed at step 550 on top of the trapping region; and the finFETs are completed as in steps 560 and 570.

Where the trapping region is a high defect region, steps 530 and 540 are replaced by a single implantation step that forms all the trapping regions at once. Advantageously, this step is followed by a high temperature anneal. The resulting structure is similar to that shown in FIG. 6E except that the implant regions 660 in substrate 610 are replaced by defect regions in the same location.

As will be apparent to those skilled in the art, numerous variations may be practiced within the spirit and scope of the present invention. For example, while the invention has been described in terms of forming finFETs in silicon wafers, numerous semiconductor materials may also be used in the practice of the invention such as germanium, gallium arsenide, indium phosphide, indium gallium arsenide and other III-V compounds. While one process has been described for the formation of the FinFETs, other processes may also be used; and numerous variations in these processes may also be practiced. Different materials may be used as cap layers, hard mask layers and spacers; and a wide variety of etchants and etching processes may be used to remove these materials. In the interest of brevity and to avoid obscuring the invention, many details of conventional processes for forming finFETs have been left out.

What is claimed is:
1. A finFET comprising:
a substrate of semiconductor material having a first conductivity type;
a plurality of first thin segments of the semiconductor material integral with the substrate and extending in a first direction away from the substrate, each first thin segment extending lengthwise in a second direction with a channel between adjacent thin segments;
a transistor formed on each of at least two adjacent first thin segments, each transistor having source and drain regions and a gate; and
at least one elongated trapping region located in or on the substrate between two adjacent first thin segments, the elongated trapping region having a second conductivity type opposite to the first conductivity type and being coupled to a well region having the second conductivity type.

2. The finFET of claim 1 wherein the at least one trapping region traps ions produced by radiation incident on the substrate.

3. The finFET of claim 1 further comprising a field oxide formed in the channel above the elongated region.

4. The finFET of claim 1 wherein the elongated trapping region is reverse-biased relative to the substrate.

5. The finFET of claim 1 wherein the elongated trapping region is a defect region.

6. The finFET of claim 1 wherein the elongated trapping region is an epitaxial region formed on the substrate.

7. The finFET of claim 1 wherein the elongated trapping region is an epitaxial region formed on the substrate, the epitaxial region having a second conductivity type.

8. A finFET comprising:
- a substrate of semiconductor material;
- a first well region formed in the substrate and having p-type conductivity;
- a plurality of first thin segments of the semiconductor material integral with the first well region and extending in a first direction away from the substrate, each first thin segment extending lengthwise in a second direction with a channel between adjacent first thin segments;
- a transistor formed on each of at least two adjacent first thin segments, each transistor having source and drain regions and a gate;
- at least one elongated first trapping region located in or on the substrate between two adjacent first thin segments, at least one of the elongated first trapping regions having n-type conductivity and being coupled to a well region having n-type conductivity;
- a second well region formed in the substrate and having n-type conductivity;
- a plurality of second thin segments of the semiconductor material integral with the second well region and extending in the first direction away from the substrate, each second thin segment extending lengthwise in the second direction with a channel between adjacent second thin segments;
- a transistor formed on each of at least two adjacent second thin segments, each transistor having source and drain regions and a gate; and
- at least one elongated second trapping region located in or on the substrate between two adjacent second thin segments, at least one of the elongated second trapping regions having p-type conductivity and being coupled to a well region having p-type conductivity.

9. The finFET of claim 8 wherein at least one of the first and second trapping regions traps ions produced by radiation incident on the substrate.

10. The finFET of claim 8 wherein at least one of the elongated first trapping regions has n-type conductivity type and at least one of the elongated second trapping regions has p-type conductivity.

11. The finFET of claim 10 wherein the elongated first and second trapping regions are reverse-biased.

12. The finFET of claim 8 wherein the elongated first and second trapping regions are defect regions.

13. The finFET of claim 8 wherein the elongated first and second trapping regions are epitaxial regions formed on the substrate.

14. A method for forming a finFET comprising:
- forming a plurality of first thin semiconductor segments that are integral with a semiconductor substrate having a first conductivity type and are spaced apart by first channels;
- forming in or on the substrate at a bottom of at least one first channel a first trapping region, by epitaxially growing on the substrate a region having a second conductivity-type opposite the first conductivity-type; and
- forming in at least one first thin segment a transistor having source and drain regions and a gate.

15. The method of claim 14 wherein the first trapping region is formed by implanting ions having a second conductivity-type opposite the first conductivity-type.

16. The method of claim 14 further comprising the step of forming the first trapping region by implanting ions having sufficient energy to destroy some of the crystalline structure of the substrate.

17. The method of claim 14 wherein first thin semiconductor segments are integral with a first well region in the semiconductor substrate, the first well region having p-type conductivity, further comprising:
- forming a plurality of second thin semiconductor segments that are integral with a second well region in the semiconductor substrate and are spaced apart by second channels, the second well region having n-type conductivity;
- forming in or on the substrate at a bottom of at least one second channel a second trapping region; and
- forming in at least one second thin segment a transistor having source and drain regions and a gate.

* * * * *